United States Patent [19]

Lehmann

[11] 4,379,271
[45] Apr. 5, 1983

[54] INPUT SELECTION ARRANGEMENT FOR APPLYING DIFFERENT LOCAL OSCILLATOR SIGNALS TO A PRESCALER OF A PHASE-LOCK LOOP TUNING SYSTEM

[75] Inventor: William L. Lehmann, Indianapolis, Ind.

[73] Assignee: RCA Corporation, New York, N.Y.

[21] Appl. No.: 180,580

[22] Filed: Aug. 25, 1980

[51] Int. Cl.³ .......................... H04B 1/16, H04N 5/44
[52] U.S. Cl. .......................................... 331/49; 331/2; 455/180; 455/188
[58] Field of Search ........................................ 331/2, 48, 331/49; 455/179, 180, 182, 188, 192, 193, 195, 196, 197; 334/1, 47

[56] References Cited

U.S. PATENT DOCUMENTS 4,023,106 5/1977 Utsunomiya .
4,127,820 11/1978 Beelitz et al. .................. 455/180

OTHER PUBLICATIONS

"RCA Television Service Data-Chassis CTC 91 Series"; File 1978, C-3; p. 24; RCA Corporation-1978.

Primary Examiner—David C. Nelms
Assistant Examiner—Edward P. Westin
Attorney, Agent, or Firm—E. M. Whitacre; P. J. Rasmussen; P. M. Emanuel

[57] ABSTRACT

In a multiband tuner, an input arrangement for selectively applying first and second local oscillator signals to a single input of a prescaler of a phase locked loop tuning system includes a first capacitor connected in series from the output of a first local oscillator to the prescaler input, a second capacitor and inductor connected in series from one output of a second local oscillator to the same prescaler input and a diode switching arrangement for selectively coupling a third capacitor between the junction of the second capacitor and the inductor and signal ground when the first local oscillator is enabled to operate. The first capacitor, inductor and third capacitor comprise a matching network for the output of the first local oscillator. The second capacitor and inductor form a series tuned circuit in the frequency band of the second local oscillator which rejects signals in the frequency band of the first local oscillator. The arrangement is particularly advantageous for allowing the UHF input of a prescaler intended for a VHF/UHF tuner to be used for dividing the frequency of a superband cable local oscillator signal as well as for dividing the frequency of a UHF local oscillator signal.

7 Claims, 1 Drawing Figure

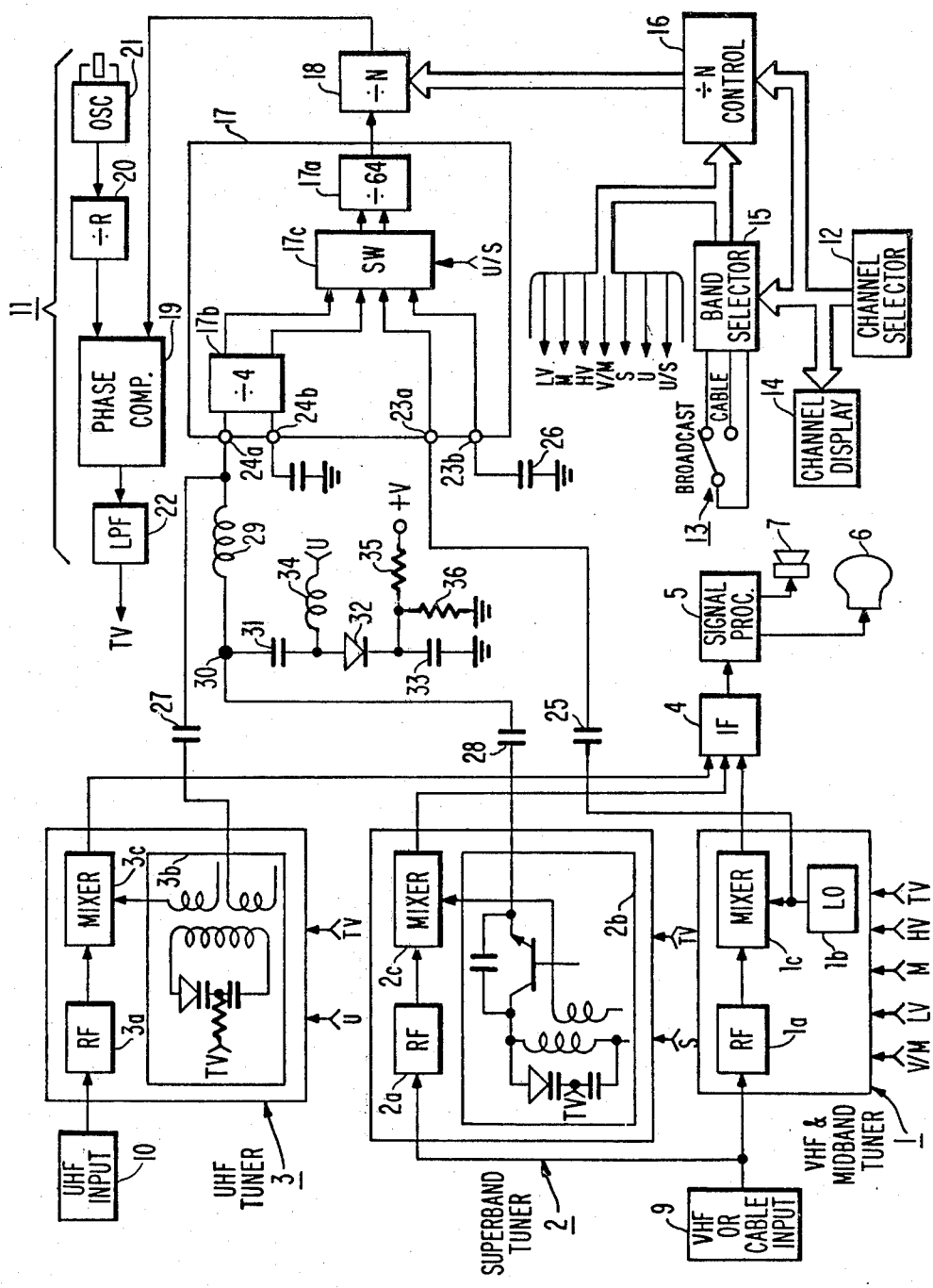

INPUT SELECTION ARRANGEMENT FOR APPLYING DIFFERENT LOCAL OSCILLATOR SIGNALS TO A PRESCALER OF A PHASE-LOCK LOOP TUNING SYSTEM

The present invention generally concerns input arrangements which are selectively adaptive to different input signal requirements.

Phase-locked loop (PLL) tuning systems employ at least one voltage controlled oscillator for generating a local oscillator signal and a closed loop arrangement for controlling the frequency of the local oscillator signal. The closed loop arrangement includes programmable digital counters as programmable frequency dividers by which a signal proportional in frequency to the local oscillator signal by a programmable factor related to the selected channel is generated. The latter signal is compared to a reference frequency signal to derive a control voltage for the voltage controlled oscillator. Local oscillator signals employed in television receivers have frequencies, e.g., in the United States between 101 and 931 MHz, too high to be divided by the programmable counters of the PLL tuning system. Accordingly, a digital counter, often referred to as a prescaler, is employed to divide the frequency of the local signals sufficiently to enable the programmable counters of the PLL tuning system to respond reliably. Furthermore, since a single voltage controlled oscillator does not have sufficient frequency range to generate all of the local oscillator frequencies, several voltage controlled oscillators for respective bands within the range of local oscillator frequencies are typically employed.

In the past, television tuners have been capable of tuning over the VHF and UHF bands associated with broadcast channels. Presently, because cable television installations have become more prevalent, television manufacturers have begun to provide tuners which are also capable of tuning channels in the cable bands. Prescalers which have been included in PLL tuning systems for the VHF and UHF bands have inputs for the VHF and UHF bands. With the addition of cable bands, prescalers must also be capable of receiving local oscillator signals for the cable bands as well as the VHF and UHF bands. The present invention may be advantageously employed to enable one of the inputs of a prescaler used for a broadcast band to also be used for a cable band thereby eliminating the need for an extra prescaler input.

Specifically, the present invention includes an input filter network for applying first and second local oscillator signals generated by first and second local oscillators associated with respective bands to a common input terminal of a prescaler. A switching network selectively configures the input network for applying the first local oscillator signal to the common input terminal of the prescaler, e.g., by maximizing the transfer of the first local oscillator signal to the prescaler, when the first local oscillator is enabled to operate and configures the input network for applying the second local oscillator signal to the common input of the prescaler, e.g., by rejecting signals in the first band, when the second local oscillator is enabled to operate. Such an arrangement is particularly desirable where the first local oscillator is employed for a higher frequency band than the second local oscillator. In this case, harmonics of the second local oscillator signal may be within the first band. Since a prescaler employed in a PLL tuning system including the two local oscillators, absent the present invention, responds to signals in both the first and second bands, when the second local oscillator is enabled to operate when a channel in second band is selected, harmonics of the second local oscillator may be counted by the prescaler and thereby adversely affect the operation of the PLL tuning system.

The invention will be described with reference to a specific embodiment as it may be incorporated in a television receiver shown in a sole accompanying FIGURE.

The television receiver of the FIGURE includes three tuner sections 1, 2 and 3 for heterodyning broadcast and cable RF arriers to produce an IF signal. The IF signal is processed by an IF signal section 4 and its picture and sound components are processed by a signal processing section 5 to condition a picture tube 6 to produce an image and a speaker 7 to produce an audio response.

In the United States RF carriers heterodyned by tuners 1, 2 and 3 reside in the frequency bands indicated in the following table.

| BAND | RF RANGE(MHz) | CHANNEL NUMBER | LO RANGE(MHz) |
|---|---|---|---|
| low VHF broadcast(LV) | 54–88 | 2–6 | 101–129 |
| midband cable(M) | 90–96 | (A − 5)-I | 137–215 |
| high VHF broadcast(HV) | 174–216 | 7–13 | 221–257 |
| super band cable(S) | 216–402 | J-(W + 17) | 263–443 |
| UHF broadcast(U) | 470–890 | 14–83 | 517–931 |

Tuner 1 heterodynes RF carriers in the VHF broadcast and midband cable bands. Tuner 2 heterodynes RF carriers in the super band cable bands. Tuner 3 heterodynes RF carriers in the UHF broadcast band.

A VHF antenna network (not shown) or a cable installation (not shown) is selectively connected by a user to an input unit 9 which includes a high pass filter for passing RF carriers in the VHF broadcast and superband and midband cable bands and rejecting signals outside these bands. Input unit 9 is connected to tuner 1 and tuner 2. A UHF antenna network (not shown) is connected to an input unit 10 which includes an impedance transforming network for transforming balanced impedance configuration of the UHF antenna network to an unbalanced impedance configuration substantially matching the input of tuner 3.

Each of tuners 1,2 and 3 includes an RF section "a" for selecting a particular RF carrier associated with a selected channel, a local oscillator (LO) "b" for generating a local oscillator signal having the appropriate frequency for heterodyning the selected RF carrier, and a mixer "c" for combining the selected RF carrier and local oscillator signal to produce the IF signal. In each of tuner 1,2 and 3 RF section "a" and local oscillator "b" include voltage controlled tuned circuits having its frequency response controlled in response to the magnitude of a tuning voltage (TV) generated by a phase locked loop tuning voltage generator, generally indicated as 11, set in accordance with the selected channel. Typically, the tuned circuits include the parallel combination of an inductive circuit and a varactor diode which is reverse biased so as to exhibit a capacitive reactance having a value determined by the magnitude of the tuning voltage. Since tuner 1 must tune over a frequency range too large to permit the use of a single inductor in each of its tuned circuits, its tuned circuits include respective inductor selection arrangements to select the appropriate inductor configuration for each of the bands.

Channels are selected by a channel selection unit 12 including a calculator-like keyboard (not shown) which has keys for each of the decimal digits 0 through 9 and input logic (not shown) for generating first and second groups of BCD (binary coded decimal) signals representing the tens and units decimal digits of a channel number corresponding to a selected channel in response to the sequential depression of the respective keys. The channel numbers for the various bands are indicated in the above table.

It will be noted that the cable channels are identified by letters as well as numbers. A switch 13 is provided to enable the keyboard of channel selection unit 12 to be used to select cable channels as well as broadcast channels. When switch 13 is in the BROADCAST position, operation of keys of channel selection unit 12 corresponding to the tens and units digit of a broadcast channel number causes the tuning of a respective broadcast carrier. When switch 13 is in the CABLE position, sequential operation of keys of channel selection unit 12 corresponding to the tens and units digit of a broadcast channel number causes the tuning of a respective cable carrier which has been assigned, as indicated on a table supplied with the receiver, to the broadcast channel number.

The BCD signals generated by channel selection unit 12 are applied to a channel number display unit 14, a band selector 15 and a programmable divider control unit 16 of phase-locked loop tuning voltage generator 11. Band selector 15, which is also responsive to the position of switch 13, generates band selection signals representative of the band of the selected channel. In addition to band selection signals for the LV, M, HV, S and U bands, band selection unit 15 generates a V/M band selection signal when the selected channel is in one of the LV, HV or M bands and a U/S band selection when the selected channel is in one of the U or S bands. The V/M, S and U band selection signal activate the tuners 1, 2 and 3, respectively, to heterodyne the corresponding RF carriers. The LV, M and HV band selection signals select the respective inductor configurations of the tuned circuits of tuner 1.

Phase-locked loop tuning voltage generator 11 includes a prescaler 17 for dividing the frequency of a local oscillator signal applied to it from one of tuners 1, 2 and 3 by factor K sufficient to bring the frequency of the resultant signal within the operating range of a following programmable counter serving as a programmable divider 18. Programmable divider 18 divides the frequency of the output signal of prescaler 17 by a factor N determined by a control unit 16 in accordance with the channel number and band of the selected channel. A phase comparator 19 compares the frequency of the output signal of programmable divider 18 and a reference frequency signal. The reference frequency is derived by a frequency divider ($\div$R) 20 which divides the output signal of a crystal oscillator 21. Phase comparator 19 generates an error signal having pulses with widths and transition directions related to the magnitude and sense, respectively, of the deviation between the frequencies of the output signal of programmable divider 18 and reference frequency divider 20. The error signal is filtered by a low pass filter (LPF) 22 to generate the tuning voltage (TV). After a channel has been selected, at steady state, the frequency of a local oscillator signal, $f_{LO}$, to the frequency of crystal oscillator 21, $f_{XTAL}$, is expressed by the equation:

$$f_{LO} = \frac{NK}{R} f_{XTAL}$$

If K/R $f_{XTAL}$ is chosen as 1 MHz, N will equal the frequency, in MHz, of the local oscillator signal. The frequency range of the local oscillator signal in each band is indicated in the above table.

An integrated circuit high frequency counter suitable for use as prescaler 17 is available from RCA Solid State Division, Somerville, N.J. under commercial part numbers CA3136 and CA3179. Such a prescaler is described in U.S. Pat. No. 4,127,820 entitled "Electrical Circuit for Multiplexing and Dividing Different Bands or Frequencies" issued on Nov. 28, 1978 in the names of Beelitz and Preslar and assigned like the present application to RCA Corporation, hereby incorporated by reference.

Prescalers of the type identified above are intended to be used for dividing the frequency of local oscillator signals generated in the VHF and UHF tuners. Since UHF local oscillator frequencies are approximately four times higher than the VHF local oscillator frequencies, the prescalers are arranged to selectively divide the frequency of the UHF oscillator signal by a divisor four times higher than the divisor employed for the VHF local oscillator signal. Accordingly, prescaler 17 includes a common frequency divider section 17a for dividing both VHF and UHF local oscillator by a predetermined factor, e.g., sixty-four, preceded by an extra divider section 17b for dividing only the UHF local oscillator signal by an extra division factor of four. The UHF local oscillator signal is applied to extra divider section 17b and the output signal of the extra divider section is selectively applied through a switching arrangement 17c to the common divider section 17a in response to a U/S bandswitching signal. The U/S bandswitching signal is employed since extra UHF divider section 17b is also used for super band cable channels. The VHF signal is selectively applied to common divider section 17a by switching arrangement 17c in response to the absence of the U/S bandswitching signal.

Prescalers of the type identified above include differential amplifiers in the counter stages since such stages when driven differentially, i.e., by two out-of-phase input signals, are more sensitive and noise immune than single-ended arrangements, i.e. those receiving a single input signal referenced to ground potential. Accordingly, prescaler 17 includes two input terminals 23a and 23b for the VHF portions of prescaler and two input terminals 24a and 24b for the UHF portion of prescaler 17, each pair for receiving differential local oscillator signals from the respective local oscillators.

Although the prescaler inputs for each of the VHF and UHF bands are intended to be driven differentially, they may be driven with a single-ended input signal to avoid the undesirable aspects of being differentially driven discussed below. In this condition the input signal is applied to one of the terminals and the other terminal is bypassed by a capacitor to signal ground. If the second input is not bypassed, the gain or sensitivity of the prescaler tends to be substantially reduced. Thus, for example, in the structure of FIG. 1, first VHF input terminal 23a of prescaler 17 receives a VHF local oscillator signal from the local oscillator of tuner 1 through a DC isolation capacitor 25 and second VHF input terminal 23b of prescaler 17 is bypassed to signal ground by a capacitor 26.

It has been found desirable to drive the prescaler input with a single single-ended signal for each range since it avoids the necessity for generating and applying two out-of-phase signals. The latter is undesirable since withdrawing signals from the local oscillator at two points tends to weaken its response. In addition, it requires a DC isolation capacitor for each output of the local oscillator. These two capacitors tend to make the tuning of the local oscillator more difficult. Driving a prescaler input with a single single-ended signal is also advantageous since the integrated circuit comprising the prescaler need only be tested for operation in response to single input signal per band rather than two thereby affecting a significant component and testing cost saving. Finally, driving a prescaler input section of a prescaler intended for use in a VHF/UHF tuner for dividing the frequency of VHF and UHF local oscillator signals in a single-ended configuration enables the prescaler to be used in a VHF/UHF/cable tuner for dividing the frequency of cable band local oscillator signals in addition to the VHF and UHF local oscillator signals. That is, the UHF section of prescaler 17 can be used to divide the frequency of the local oscillator signal generated by the local oscillator of superband cable band tuner 2 as well as the local oscillator signal generated by the local oscillator of UHF broadcast band tuner 3.

Specifically, since the UHF section of prescaler 17 may be driven with a single single-ended signal applied to each of input terminals 24a and 24b, one of the UHF or superband cable local oscillator signals can be coupled to terminal 24a and the other coupled to terminal 24b. However, this arrangement also requires a bypass capacitor and switch to be connected in series between each of an UHF input terminals 24a and 24b and signal ground. The bypass capacitors are needed for the reason of not degrading the gain or sensitivity of the differential input configuration referred above in connection with a single-ended drive arrangement. The switch is utilized to disconnect the respective by-pass capacitor when the local oscillator coupled to the associated input is enabled. Such an arrangement is undesirable since it requires a switch arrangement connected to each of UHF input terminals 24a and 24b. More importantly, perhaps, it is undesirable, since it requires the testing of two, rather than one, UHF input sections. The present prescaler input switching arrangement, to be described below, allows a single-ended arrangement to be used while avoiding these disadvantages.

The present input switching arrangement of prescaler 17 for the UHF and superband local oscillator signals includes a capacitor 27 connected in series between the local oscillator output of tuner 3 and the first UHF input terminal 24a of prescaler 17 for applying the UHF local oscillator signal to first UHF input terminal 24a of prescaler 17. A capacitor 28 is connected in series with an inductor 29 between the superband local oscillator output of tuner 2 and first UHF input terminal 24a of prescaler 17 for applying the superband cable local oscillator signal to first UHF input terminal 24a of prescaler 17. A bypass capacitor is connected between the second UHF input terminal 24b and signal ground for effecting single-ended signal injection for both of the UHF and superband local oscillator signals. A capacitor 31, switching diode 32 and capacitor 33 are connected in series between a junction 30 between capacitor 28 and inductor 29 and signal ground. The U band selection signal is applied to the anode of switching diode 32 through a choke 34. A fixed voltage (e.g., approximately 3 vdc) is developed from a supply voltage +V by a resistive voltage divider including resistors 35 and 36 and applied to the cathode of switching diode 32.

When a UHF channel is selected, the U bandswitching signal is at a relatively high level (e.g., +18 vdc) and the S bandswitching signal is at a relatively low level (e.g. +3 vdc). In response, UHF tuner 3 is activated to operate and superband tuner 2 is inactivated. In addition, switching diode 32 is forward biased and therefore rendered conductive. In this configuration, junction 30 is bypassed to signal ground through capacitor 31, diode 32 and capacitor 33 and capacitor 27, inductor 29, capacitor 31 and capacitor 33 form a matching network for the output circuit of the UHF local oscillator of tuner 3 to optimize the coupling of the UHF local oscillator signal to prescaler 17. As shown, the latter output circuit may comprise a varactor diode in parallel combination with the primary of a transformer of which a first secondary winding is utilized to supply a local oscillator signal to prescaler 17 and a second secondary winding is utilized to supply local oscillator signal to the mixer of UHF tuner 3. The values of capacitors 27, 31 and 33 and inductor 29 are selected to form, at least approximately, a complex conjugate impedance of the output circuit of the UHF oscillator and any interconnections throughout the UHF band.

When a superband channel is selected, the U bandswitching signal is at the low level and the S bandswitching signal is at the high level. In response, superband tuner 2 is activated to operate and UHF tuner 3 is inactivated. In addition, switching diode 32 is reverse biased and therefore nonconductive. In this configuration, junction point 30 is not bypassed to signal ground through capacitor 31, diode 32 and capacitor 33 and capacitor 28 and inductor 29 form a series resonant circuit. The values of capacitor 28 and inductor 29 are selected, in association with the output capacitance of the superband local oscillator, comprising, as shown, for example, the capacitance at the emitter of a transistor arranged in a Colpitts oscillator configuration, and the input capacitance at terminal 24a of prescaler 17, to resonate at a frequency substantially at the center frequency of the superband frequency range, e.g., at 353 MHz. The series resonant circuit allows local oscillator signals in the superband frequency range to be coupled to prescaler 17 but inhibits signals in the UHF frequency range from reaching prescaler 17. This is desirable since the superband local oscillator tends to generate harmonics which are in the UHF band to which prescaler 17 will respond thereby producing an unreliable output signal.

Thus, not only does the present prescaler input switching network enable a single single-ended input arrangement to be used for two separate local oscillator signals, but it selectively forms a matching network for optimizing the injection of the UHF local oscillator signal or a rejection filter for attenuating undesired signals outside the superband frequency range. It should be noted that were the UHF and superband local oscillators selectively applied to terminal 24a through respective switching diodes as one alternate means for providing the benefits of a single ended input arrangement, such arrangement would require two switching diodes and associated circuits. Moreover, in the latter arrangement, it would still be desirable to provide separate and selectively enabled UHF matching and superband filtering networks tending to require a much higher number of components than the present arrangement.

It will be appreciated that while the present arrangement was disclosed with respect to a specific arrangement associated with the tuning of UHF and superband carriers, it will be appreciated that it can be modified for other frequency bands. This and other modifications are intended to be within the scope of the present invention defined by the following claims.

What is claimed is:

1. Apparatus, comprising:
   frequency divider means having an input terminal for dividing the frequency of a local oscillator signal applied to said input terminal;
   a first local oscillator for generating at a first output point a first local oscillator signal having a frequency in a first band of frequencies when enabled to operate;
   a second local oscillator for generating at a second output point a second local oscillator signal having a frequency in a second band of frequencies lower in frequency than said first band when enabled to operate;
   band selection means for selectively enabling said first and second local oscillator means to operate to generate respective ones of said first and second local oscillator signals;
   input means including reactive components coupled between said first and second output points and said input terminal; and
   configuration selection means coupled to said input means and said band selection means for selectively configuring said input means to form a first reactive network having a first frequency response characteristic for passing signals in said first band when said first local oscillator is enabled and configuring said input means to form a second reactive network having a second frequency response characteristic different from said first frequency response characteristic for passing signals in said second band and rejecting signals in said first band when said second local oscillator is enabled.

2. The apparatus recited in claim 1 wherein:
   said first network is a matching network having an impedance which at least approximates the complex conjugate of the output impedance at said first output point.

3. The apparatus recited in claim 2 wherein:
   said frequency divider means includes first and second input terminals for receiving different input signals; and
   said input means includes coupling means for coupling each of said first and second local oscillators to said first input terminal and bypass means for bypassing said second input terminal to a point at signal ground to condition said frequency divider means for single-ended operation.

4. The apparatus recited in claim 3 wherein:
   said coupling means includes a first capacitor coupled between said first output point and said first input terminal; and a second capacitor and an inductor coupled in series between said second output point and said first input point;
   said bypass means includes a third capacitor coupled between said second input point and said signal ground point; and
   said configuration selection means includes at least a fourth capacitor and switching means coupled to said band selection means for selectively coupling a point intermediate said second capacitor and said inductor to said signal ground through said fourth capacitor when said first local oscillator is enabled to operate.

5. The apparatus recited in claim 4 wherein:
   said switching means includes a switching diode.

6. The apparatus recited in claim 5 wherein:
   said second capacitor and said inductor form a series resonant circuit having a resonant frequency at least approximately in the center of said second band.

7. The apparatus recited in claim 6 wherein:
   said first band is the UHF broadcast band; and said second band is the superband cable band.

* * * * *